(12) United States Patent
Nishimura et al.

(10) Patent No.: US 6,169,505 B1
(45) Date of Patent: Jan. 2, 2001

(54) MULTI-CHANNEL, PARALLEL, MATCHED DIGITAL-TO-ANALOG CONVERSION METHOD, MULTI-CHANNEL, PARALLEL, MATCHED DIGITAL-TO-ANALOG CONVERTER, AND ANALOG DRIVE CIRCUIT INCORPORATING SAME

(75) Inventors: Ken A. Nishimura, Fremont, CA (US); Travis N. Blalock, Charlottesville, VA (US)

(73) Assignee: Agilent Technologies, Inc., Palo Alto, CA (US)

( * ) Notice: Under 35 U.S.C. 154(b), the term of this patent shall be extended for 0 days.

(21) Appl. No.: 09/249,600

(22) Filed: Feb. 12, 1999

(51) Int. Cl.$^7$ .................................................. H03M 1/00
(52) U.S. Cl. ................................................... 341/141
(58) Field of Search ................................. 341/144, 141, 341/142, 155

(56) References Cited

U.S. PATENT DOCUMENTS 5,550,528 * 8/1996 Offord et al. ..................... 340/146.2
5,592,113 * 1/1997 Chen ................................... 345/102
5,673,059 * 9/1997 Zavracky et al. ....................... 345/8

* cited by examiner

*Primary Examiner*—Peguy JeanPierre (57) ABSTRACT

Matched digital-to-analog conversions are performed in which, in each of N parallel channels, a digital input word is converted into a corresponding analog output. A digital sequence is generated, a time-varying analog signal having a predetermined relationship to the digital sequence is generated in response to the digital sequence, and the digital sequence and the time-varying analog signal are distributed to the N parallel channels. In each of the N parallel channels, the digital input word is digitally compared with the digital sequence, and, when the digital sequence is numerically equal to the digital input word, the time-varying analog signal is sampled to provide the analog output. The single time-varying analog signal derived from the single digital sequence at an operational speed at which high accuracy and low power consumption can be easily attained enables well-matched digital-to-analog conversions to be performed in any number of channels ranging from a few to many thousands.

24 Claims, 5 Drawing Sheets

MULTI-CHANNEL, PARALLEL, MATCHED DIGITAL-TO-ANALOG CONVERSION METHOD, MULTI-CHANNEL, PARALLEL, MATCHED DIGITAL-TO-ANALOG CONVERTER, AND ANALOG DRIVE CIRCUIT INCORPORATING SAME

FIELD OF THE INVENTION

The invention relates to digital-to-analog conversion and, in particular, to digital-to-analog conversion using multi-channel, parallel digital-to-analog converters that have from a few to many thousands of channels all having accurately-matched conversion characteristics.

BACKGROUND OF THE INVENTION

The growing power of digital signal processors (DSPs) has increased the need for analog-to-digital converters to convert analog signals originating in the physical world to digital signals, and digital-to-analog converters to restore digital signals to the analog signals required in the physical world. At the same time, the increased processing power of DSPs has created the need to increase the throughput of analog-to-digital converters and digital-to-analog converters. One approach to increasing the speed of a digital-to-analog converter is to increase the speed of the converter itself; another is to perform the conversion using parallel signal paths. While not all applications lend themselves to conversion using parallel signal paths, for those that do, conversion using parallel signal paths offers advantages in power, performance or both. Moreover, conversion using parallel signal paths can provide a faster conversion rate than the fastest conversion rate of a single converter.

A specific example of an application in which conversion using parallel signal paths works well is an array structure. An array structure typically has data paths that are independent in one or more dimensions. This structure allows N digital-to-analog converters working in parallel to generate N parallel analog signals to fill the array rather than using a single digital-to-analog converter to generate sequentially an analog signal for each element of the array.

One example of an array structure in which using parallel digital-to-analog converters offers advantages is the array of pixel circuits in a miniature video display based on a light valve that uses a ferroelectric liquid crystal material. Such a miniature video display can form part of a wearable eyeglass display that can be used to display computer graphics when connected to the video output of a computer, especially a laptop computer, and can be used to display video when connected to the video output of a TV receiver, a video cassette player or a DVD player, especially a portable DVD player. Such a miniature video display is described in U.S. patent applications Ser. Nos. 09/070,487 and 09/070,669, assigned to the assignee of this disclosure and incorporated herein by reference. One embodiment of the light valve of such a miniature video display includes an array of 1024× 768 pixels, each including a reflective electrode driven by a respective pixel circuit. The pixel circuit converts an analog sample derived from an analog video signal into a two-state drive signal having a duty cycle that defines the apparent brightness of the pixel.

When the miniature video display just described is driven by a conventional analog video signal, analog samples are derived from each line of the analog video signal and are distributed via column busses to the pixel circuits in each row of the array. Recently, however, it has been proposed to use the video display just described as the viewfinder of a digital camera that generates a digital video signal. To drive the video display, the digital video signal generated by the camera must be converted to an analog signal by a digital-to-analog converter. Since the analog samples of each line of the video signal are distributed via the column buses, the required digital-to-analog conversion speed could be obtained by performing the conversion using 1024 parallel digital-to-analog converters, one for each column.

However, the inherent mismatch problems of analog circuitry is a major drawback in using independent, parallel digital-to-analog converters as just described. Although great care can be taken to minimize the effects of non-ideal circuit characteristics and physical device mismatching, it is not usually possible to avoid completely the artifacts produced by these factors. In the example just described, mismatches between the digital-to-analog converters cause vertical banding in the picture generated by the miniature video display. Such vertical banding is easily noticeable in pictures lacking fine detail.

Techniques that mitigate the effects of analog circuit mismatching exist and are often applied to simple analog circuits such as amplifiers. However, applying such mitigation techniques to complex analog circuits such as digital-to-analog converters is less straightforward and usually involves significant additional circuitry. Such additional circuitry increases power consumption and cost. When an application, such as that described above, calls for massively-parallel digital-to-analog conversion, the correction techniques required to mitigate physical device mismatching and non-ideal circuit characteristics become cumbersome and unwieldy.

Figure 1:
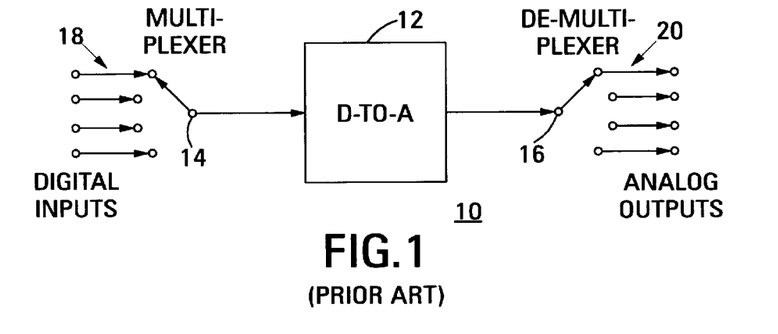
FIG. 1 is a block diagram of a conventional multi-channel digital-to-analog converter.

One conventional way of performing multiple parallel digital-to-analog conversions that avoids the mismatch issues described above is to use a single digital-to-analog converter preceded by a digital multiplexer and followed by an analog demultiplixer, as shown in FIG. 1. In this, the multi-channel digital-to-analog converter 10 is composed of the single high-speed digital-to-analog converter 12 preceded by the digital multiplexer 14 and followed by the analog demultiplexer 16. The N inputs of the multiplexer are connected to the N parallel digital input lines 18. The output of the multiplexer is connected to the input of the digital-to-analog converter. The analog output of the digital-to-analog converter is connected to the input of the demultiplexer. The N outputs of the demultiplexer are connected to the N parallel analog output lines 20.

The multiplexer 14 multiplexes the N channels (N=4 in the highly-simplified example shown) of digital input data received on the parallel input lines 18 to generate a single serial digital input. The serial digital input is fed to the digital-to-analog converter 12. The demultiplexer 16 demultiplexes the analog output from the digital-to-analog converter into the N parallel analog output lines 20.

The multi-channel digital-to-analog converter shown in FIG. 1 avoids the drawbacks of multiple, parallel, independent digital-to-analog converters, but has three significant drawbacks of its own. First, the demultiplexer 16 can introduce errors between its input and its outputs that can be different for each output. Thus, this approach does not offer a complete solution to the mismatch problem described above.

Second, the operational speed requirements of the digital-to-analog converter 12 rapidly become unattainable as the number of parallel channels increases. For example, a sequential-color video display having a VGA resolution in which N=640, and a frame rate of 225 Hz (75 Hz×3 primary colors) would typically have a line rate of 108 kHz. Accounting for switching overhead, a line rate as high as 200 kHz is not unreasonable. To provide 640 analog samples per line, the digital-to-analog converter 12 would have to perform 128 million digital-to-analog conversions per second. In higher-resolution displays, N can approach 2,000 and the line rate can approach 1 MHz as refresh rates continue to increase. Such displays would require the digital-to-analog converter 12 to perform in excess of 1 billion ($10^9$) digital-to-analog conversions per second. It is not practical to construct such converters using current mainstream CMOS technologies. Moreover, the power consumption of such high-speed converters makes them very unattractive for portable applications.

Third, due to the serial conversion processing performed by the digital-to-analog converter 12, the individual parallel analog outputs are generated at different times and are transitory. To generate non-transitory analog outputs, each analog output would additionally include a track-and-hold circuit or a sample-and-hold circuit. To generate analog outputs that change level simultaneously, the track-and-hold or sample-and-hold circuits would have to have clocked outputs. These additional circuits would significantly increase the complexity of the digital-to-analog converter shown in FIG. 1.

The digital camera viewfinder application described above could use a simplified version of the multi-channel digital-to-analog converter 10 shown in FIG. 1 in which the multiplexer 14 and the demultiplexer 16 are omitted. The multiplexer can be omitted because the digital camera generates a serial digital video output signal. Moreover, the output of the digital-to-analog converter 12, when fed with the serial digital output signal generated by the camera, is a conventional analog video signal. Circuits for deriving analog samples from an analog video signal and for performing a column-wise distribution of such analog samples already exist in the circuitry of the light valve. This allows the demultiplexer to be omitted. Such a simplified digital-to-analog converter would not suffer from the demultiplexer mismatch problem described above because the converter lacks a demultiplexer. However, even in this application, the digital-to-analog converter shown in FIG. 1 still suffers from such shortcomings as the difficulty of making the digital-to-analog converter operate sufficiently-fast with low power consumption and the need for additional circuits to hold the analog samples on the column busses.

What is needed, therefore, is a multi-channel digital-to-analog converter that generates well-matched analog output signals that are simultaneously valid at least during part of each conversion cycle, that can be constricted using conventional CMOS technologies, and that has a power consumption compatible with battery operation.

What is also needed is a multi-channel digital-to-analog converter that can be easily scaled to provide the number of digital-to-analog conversion channels required by a large number of different applications.

SUMMARY OF THE INVENTION

The invention provides a method of performing matched digital-to-analog conversions in which, in each of N parallel channels, a digital input word is converted into a corresponding analog output. In the method, a digital sequence is generated, and a time-varying analog signal having a predetermined relationship to the digital sequence is generated in response to the digital sequence. The digital sequence and the time-varying analog signal are distributed to the N parallel channels. In each of the N channels, the digital input word is digitally compared with the digital sequence, and, when the digital sequence is numerically equal to the digital input word, the time-varying analog signal is sampled to provide the analog output.

The invention also provides a multi-channel, parallel, matched digital-to-analog converter that, in each of N channels, receives a digital input word and generates an analog output in response to the digital input word. The digital-to-analog converter comprises a digital sequence generator, an analog signal generator and, in each of the N channels, a channel circuit. The digital sequence generator generates a digital sequence. The analog signal generator operates in response to the digital sequence to generate a time-varying analog signal having a predetermined relationship to the digital sequence for distribution to the N channels. Each of the channel circuits includes a digital comparator and an analog sampler. The digital comparator is connected to receive the digital sequence and the digital input word of the channel, and is configured to indicate when the digital sequence is numerically equal to the digital input word. The analog sampler is connected to receive the time-varying analog signal, operates in response to the digital comparator, and is configured to provide, as the analog output of the channel, a sample of the time-varying analog signal when the digital comparator indicates that the digital sequence is numerically equal to the digital input word.

Finally, the invention provides an analog drive circuit for a video display. The analog drive circuit operates in response to a digital video signal that includes frames of digital words arranged in lines. The analog drive circuit comprises pixel circuits arranged in an array of rows and columns. Each pixel circuit includes a sample input and a selector input. Column busses interconnect the sample inputs of the pixel circuits in respective columns of the array, and row busses interconnect the selector inputs of the pixel circuits in respective rows of the array A row selector has outputs connected to respective row busses. A video demultiplexer includes an input connected to receive the digital video signal, and has outputs corresponding to the columns of the array. The video multiplexer directs the digital words in the lines of the digital video signal to respective ones of the outputs. Each of the outputs receives one of the digital words in the line as a digital input word. Finally the analog drive circuit comprises a multi-channel digital-to-analog converter that includes channel circuits corresponding to the columns of the array, a digital sequence generator that generates a digital sequence and an analog signal generator. The analog signal generator operates in response to the digital sequence to generate a time-varying analog signal having a predetermined relationship to the digital sequence for distribution to the channel circuits. Each of the channel circuits comprises a digital comparator and an analog sampler. The digital comparator is connected to receive the digital sequence and the digital input word from one of the outputs of the video demultiplexer, and is configured to indicate when the digital sequence is numerically equal to the digital input word. The analog sampler is connected to receive the time-varying analog signal, includes an analog output connected to one of the column busses, and is configured to provide an analog sample of the time-varying analog signal to the analog output when the digital comparator indicates that the digital sequence is numerically equal to the digital input word.

The digital-to-analog converters and digital-to-analog conversion method described in this disclosure use a single digital sequence and a single time-varying analog signal that are common to all the conversion channels. The time-varying analog signal is generated in response to the digital sequence and has a predetermined relationship thereto. Increasing the number of channels in which digital-to-analog conversion is performed does not require any increase in the speed at which the digital sequence and the time-varying analog signal are generated. Instead, the number of conversion channels is increased by adding channel circuits, one for each additional channel. This way, a multi-channel digital-to-analog converter and conversion method capable of performing digital-to-analog conversions in any number of channels ranging from a few to many thousands can be realized by an arrangement in which the single time-varying analog signal is derived from the digital sequence at an operational speed at which high accuracy and low power consumption can be easily attained.

DETAILED DESCRIPTION OF THE INVENTION

Figure 2:
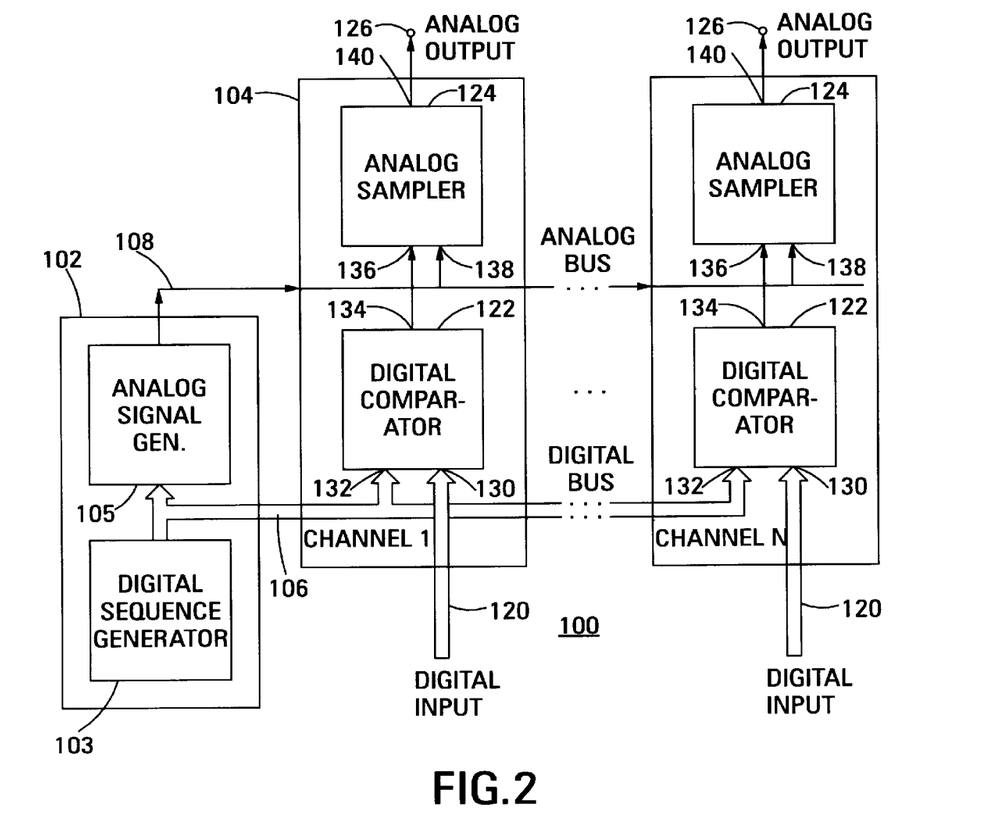
FIG. 2 is a block diagram showing a multi-channel digital-to-analog converter according to the invention.

FIG. 2 is a block diagram showing a multi-channel digital-to-analog converter 100 according to the invention. The digital-to-analog converter 100 performs the digital-to-analog conversion method according to the invention. The multi-channel digital-to-analog converter 100 is composed of the common circuitry 102 and N channel circuits 104, one for each of the N channels. Each of the channel circuits performs a digital-to-analog conversion on a single n-bit digital input word to generate a corresponding analog output level. To simplify the drawing, the channel circuits of only Channel 1 and Channel N are shown. The channel circuits of channels 2 . . . N–1 have been omitted, but are identical to those shown.

The common circuitry 102 is composed of the digital sequence generator 103 and the analog signal generator 105. The digital sequence generator has an output connected to the input of the analog signal generator and to the digital bus 106. The analog signal generator has an output connected to the analog bus 108. The digital bus and the analog bus are each connected to the channel circuit 104 of each of the channels. The digital sequence generator generates a digital sequence that the digital bus distributes to the channel circuits 104. The analog signal generator generates a time-varying analog signal in response to the digital sequence. The time-varying analog signal has a predetermined relationship to the digital sequence and is distributed to the channel circuits by the analog bus. Thus, each channel circuit receives both the digital sequence and the analog signal from the common circuitry.

The predetermined relationship between the time-varying analog signal on the analog bus 108 and the digital sequence on the digital bus 106 determines the conversion characteristic of the digital-to-analog converter 100. The predetermined relationship may be a linear relationship, in which case, the digital-to-analog converter has a linear conversion characteristic. The predetermined relationship may alternatively be a non-linear relationship, in which case, the digital-to-analog converter has a non-linear conversion characteristic. The predetermined relationship may be any known relationship that is not random.

The channel circuit 104 of Channel 1 will now be described. The channel circuit is composed of the digital input 120, digital comparator 122, the analog sampler 124 and the analog output 126. The digital comparator has a first input 130, a second input 132 and an output 134. The first input is connected to the digital input to receive the digital input word of channel 1. The second input is connected to the digital bus 106.

The analog sampler 124 has a control input 136, an analog input 138 and an output 140. The control input is connected to the output 134 of the digital comparator 122. The analog input is connected to the analog bus 108. The output is connected to the analog output 126.

Operation of the multi-channel digital-to-analog converter 100 will now be described. Operation of the common circuitry will be described first. Operation of the multi-channel digital-to-analog converter is based on a conversion period, which is a period of time during which the channel circuits 104 of the digital-to-analog converter each simultaneously perform one digital-to-analog conversion. Each of the channel circuits converts an n-bit digital input word having any value in the convertible input range of zero to $2^n-1$ to a corresponding analog signal in a defined analog output range. For example, the digital-to-analog converter may convert an eight-bit digital input word having any value in the convertible input range of $00_H$ to $FF_H$ to a corresponding analog output in the output range of 0 to +1 Volt. The relationship between the digital input word and the analog output, ignoring quantizing errors, is normally linear. However, as noted above and as will be described in more detail below, the relationship between the digital input word and analog output can alternatively be non-linear.

In the common circuitry 102 of the digital-to-analog converter 100, during each conversion period, the digital sequence generator 103 generates a digital sequence composed of n-bit numbers. The n-bit numbers constituting the digital sequence typically include every possible value in the convertible input range of the n-bit digital input word on the digital input 120. However, this is not critical to the invention: the digital sequence may include one or more n-bit numbers outside the convertible input range of the n-bit digital input word. Alternatively, the digital sequence may include every possible value in the convertible input range of the n-bit digital input word, yet the n-bit input word may have al: least one legal value that lies outside the convertible input range. An input word having a value outside of the convertible input range of the n-bit digital input word may be used as a code that automatically causes the channel circuit to hold the previously-generated analog level on its analog output.

The digital sequence generator 103 may generate a digital sequence that is a series of binary numbers. The binary numbers start at zero at the beginning of the conversion period and increment monotonically by the least-significant bit every time a predetermined clock period elapses. Alternatively, the digital sequence could be a series of Gray codes that change every time the predetermined clock period elapses.

As a further exemplary alternative, the digital sequence generator could generate a digital sequence that is a series of binary codes or Gray codes that decrements monotonically every clock period. However, although such orderliness simplifies design of the analog signal generator 105, it is not essential to the invention as long as, during the conversion period, the digital sequence includes every possible value in the convertible input range of the digital input word.

The predetermined clock period referred to above is a time that can be no longer than $1/2_n$ of the conversion period. Otherwise, the digital sequence cannot include all possible values in the convertible input range of the digital input word on the digital input 120. Preferably, the conversion period is composed of more than $2^n$ clock periods to provide additional time for the analog out put to settle prior to the end of the conversion period and for performing reset operations at the end of the conversion period. This will be discussed in more detail below with reference to FIGS. 4A–4F.

The digital sequence generator 103 feeds the digital sequence to the digital bus 106 for distribution the channel circuits 104. The digital sequence generator also feeds the digital sequence to the input of the analog signal generator 105. The analog signal generator generates the time-varying analog signal in response to the digital sequence and feeds the time-varying analog signal to the analog bus 108. The time-varying analog signal has a predetermined relationship to the digital sequence. When the digital sequence is a sequence of binary numbers, one example of the predetermined relationship is as follows: the analog level generated by the analog signal generator in response to each n-bit binary number in the digital sequence has a ratio to the maximum of the output range equal to the ratio of the n-bit binary number to the number of values in the digital input range, i.e., $2^n$. An analog level having such a relationship to the digital sequence can be generated by converting each n-bit binary number in the digital sequence to an analog level using an n-bit digital-to-analog converter as the analog signal generator. However, other circuits can be used as the analog signal generator, as will be described in more detail below.

Moreover, the predetermined relationship can be different from that stated, as will also be described in more detail below.

Operation of the channel circuit 104 of channel 1 will now be described. In the channel circuit, the first input 130 of the digital comparator 122 receives the digital input word from the digital input 120. For the purposes of this explanation, it will be assumed that the digital input word remains static during the conversion period. The second input 132 of the digital comparator is connected to the digital bus 106 and receives the digital sequence generated by the digital sequence generator 103.

The output 134 of the digital comparator 122 changes state when one of the n-bit numbers in the digital sequence is numerically equal to the digital input word. The digital comparator may be configured so that its output is in a second state only during the time that the n-bit number that is numerically equal to the digital input word is present on its second input 132, and is in a first state at all other times. Alternatively, the digital comparator may be configured to flag the analog sampler or some intermediate latch (not shown) when the n-bit number present on its second input 132 is numerically equal to the digital input word. In this case, the output of the digital comparator momentarily changes to the second state when the n-bit number on the second input of the digital comparator is numerically equal to the digital input word, and remains in the first state at all other times. As a further alternative, if the digital sequence changes monotonically, the digital comparator may be configured so that its output is in a first state when the n-bit numbers constituting the digital sequence are less than the digital input word and is in a second state at all other times; or is in the first state when the n-bit numbers constituting the digital sequence are less than or equal to the digital input word, and is in a second state at all other times.

Irrespective of the configuration of the digital comparator 122, the output 134 of the digital comparator is in the first state at the beginning of each conversion period. The output stays in the first state until one of the n-bit number in the digital sequence is numerically equal to the digital input word on the first input 130, whereupon the output changes to the second state, at least momentarily.

The output 134 of the digital comparator 122 is connected to the control input 136 of the analog sampler 124 where it acts as a control signal. The analog sampler receives the time-varying analog signal generated by the analog signal generator 105 through its analog input 138 connected to the analog bus 108. The output 140 of the analog sampler is connected to the analog output 126 of channel 1.

The analog sampler 124 may be configured as a sample-and-hold circuit in which its output 140 remains held at a voltage level to which it was previously set until the control signal on its control input 136 changes state in a predetermined direction, i.e., from the first state to the second state in this example. In response to the control signal changing state, the voltage on the output of the analog sampler changes to a level equal to the voltage level on the analog input 138 at the time that the control signal changed state. The voltage level on the analog input is equal to the level of the time-varying analog signal on the analog bus 108.

Alternatively, the analog sampler 124 may be configured as a track-and-hold circuit in which the voltage on its output 140 follows the voltage on its analog input 138 until the control signal on its control input 136 changes state in a predetermined direction, i.e., from the first state to the second state in this example. When the control signal changes state, the voltage on the output of the analog sampler stops following the voltage on the analog input and holds a voltage level equal to the voltage level on the analog input at the time that the control signal changed state. The voltage level on the analog input is equal to the level of the time-varying analog signal on the analog bus 108.

Thus, when one of the n-bit numbers in the digital sequence is numerically equal to the digital input word on the digital input 120, the output 134 of the digital comparator 122 changes state. The output 134 changing state sets the voltage on the output 140 of the analog sampler 124, and, hence, the voltage on the analog output 126, to a level equal to the voltage on the analog input 138 at the time that the output 134 changed state, i.e., at the time when one of the n-bit numbers in the digital sequence was numerically equal to the digital input word. Thus, at some point during the conversion period, the voltage on the analog output 126 changes to a level corresponding to the digital input word.

It should be noted that if the analog sampler 124 is configured as a sample-and-hold circuit, and if the digital sequence generated by the digital sequence generator 103 lacks an n-bit number that is numerically equal to the digital input word, the output 140 of the analog sampler will continue to hold the voltage level to which is was set in some prior conversion period. This feature enables a digital input word that lies outside the convertible input range to serve as a "hold the previous value" code.

All the other channel circuits 104 operate similarly. During the conversion period, the voltage on the analog output 126 of each channel circuit will be set to a level corresponding to the digital input word on the digital input 120 of the channel.

The multi-channel digital-to-analog converter described above has several advantages over previous designs. First, the conversion speed and accuracy in each channel of the converter is determined primarily by the speed and accuracy with which the analog signal generator 105 generates the time-varying analog signal in response to the n-bit numbers constituting the digital sequence. However, the analog signal generator is common to all channels. Consequently, although inaccuracies in the analog signal generator may cause overall errors, they, do not cause inter-channel mismatch errors.

The channel circuits 104 lack an analog comparator, a common source of error and inter-channel mismatching in conventional multi-channel digital-to-analog converters. Instead, each channel circuit of the multi-channel digital-to-analog converter according to the invention includes a digital comparator that compares the digital input word to the channel to the n-bit numbers constituting the digital sequence on the digital bus 106. Since the comparators are digital, there is no issue of matching between the comparators in the different channel circuits.

The only analog portion of the multi-channel digital-to-analog converter 100 that can cause inter-channel mismatches is the analog simpler 124 in each channel circuit 104. However, the analog portion of the analog sampler is mainly composed of a unity-gain amplifier. Auto-zero and similar calibration methods suitable for such amplifiers are widely known and can be used to mitigate any errors caused by the analog samplers having non-ideal or mismatched characteristics.

A further advantage of the multi-channel digital-to-analog converter according to the invention is that the number of channel circuits 104 can be increased or decreased without a significant impact on the design parameters of the common circuitry 102. Unlike other approaches, the speed and resolution requirements of the analog signal generator 105 are identical to the desired speed and resolution of any one of the channel circuits. While increasing the number of channel circuits imposes a greater load on the output of the analog signal generator due to the greater total capacitance on this output, accurate buffers with a high capacitance driving capability are well known in the art of CMOS circuitry and can be used if necessary.

Figure 3:
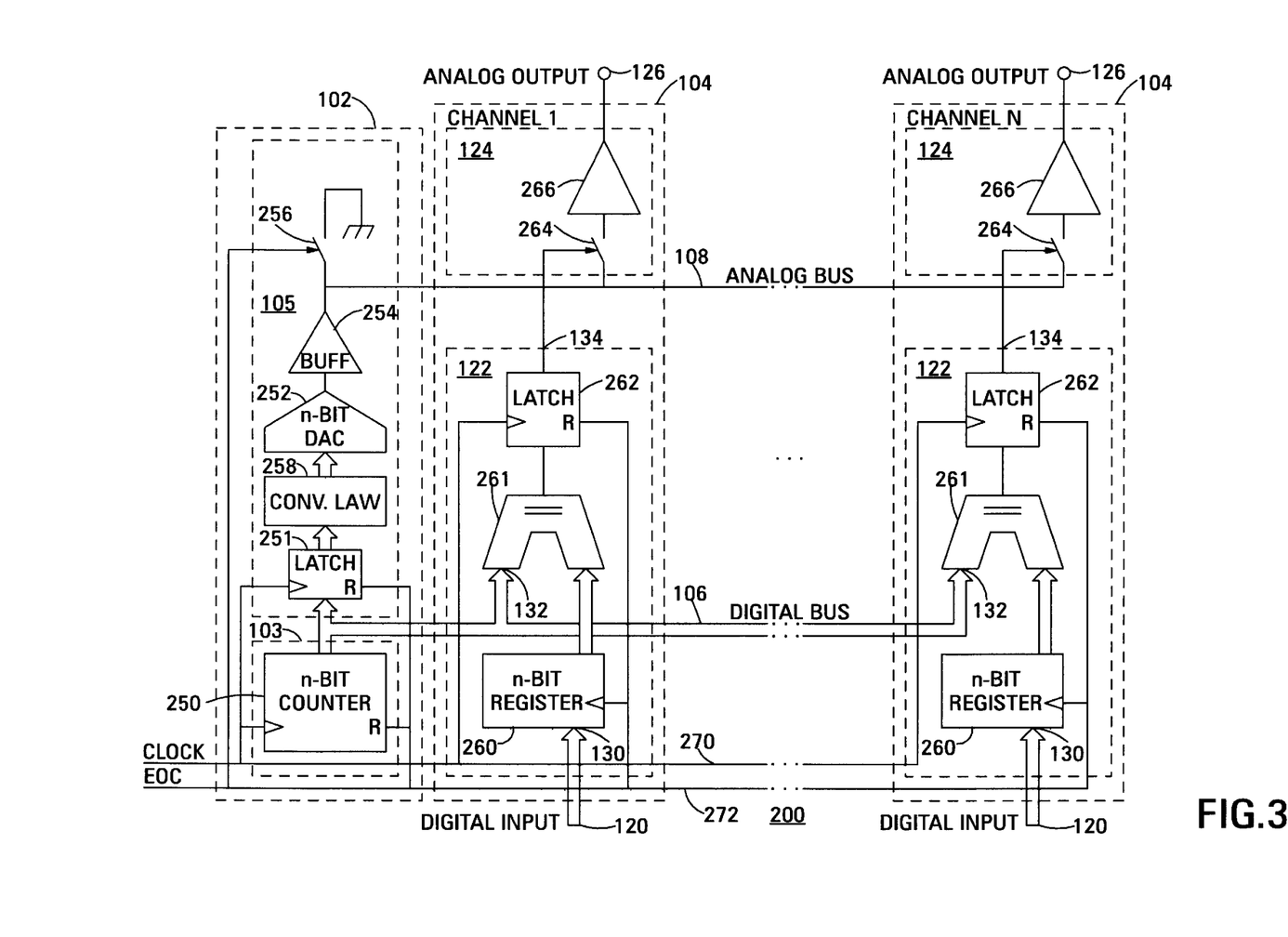
FIG. 3 is a block diagram of a preferred embodiment of a multi-channel digital-to-analog converter according to the invention.

FIG. 3 is a block diagram of a preferred embodiment 200 of a multi-channel digital-to-analog converter according to the invention. Elements of the embodiment shown in FIG. 3 that correspond to elements of the embodiment shown in FIG. 2 will be indicated using the same reference numerals and will not be described again here.

The multi-channel digital-to-analog converter 200 is composed of the common circuitry 102 and N channel circuits 104, one for each of the N channels. During a conversion period, each of the channel circuits performs a digital-to-analog conversion on a single n-bit digital input word to generate a corresponding analog output level. Again, to simplify the drawing, the channel circuits of only Channel 1 and Channel N are shown. The channel circuits of channels 2 . . . N–1 have been omitted, but are identical to those shown.

The common circuitry 102 will be described first. The common circuitry is composed of the digital sequence generator 103 and the analog signal generator 105, the outputs of which are connected to the channel circuit of each of the channels by the digital bus 106 and the analog bus 108, respectively, as described above.

In the embodiment shown in FIG. 3, the digital sequence generator 103 is composed of the n-bit digital counter 250 that has an output connected to the input of the analog signal generator 105 and to the digital bus 106. The digital counter 250 has a clock input connected to the clock line 270 that carries the clock signal CLOCK. As noted above, the clock signal CLOCK has a clock period no greater than $1/2^n$ of the conversion period. The digital counter also has a reset input connected to the end-of-count line 272 that carries the end-of-count signal EOC. The end-of-count signal resets the counter at the end of each conversion period. The common circuitry 102 may additionally include a clock signal generator (rot shown) that generates the dock signal CLOCK on the clock line 270 and the end-of-count signal EOC on the end-of-count line 272. Alternatively, these signals may be received from an external source.

During each conversion period, the n-bit digital counter 250 performs a simple binary count from zero to $2^n-1$ to generate a series of $2^n$ n-bit binary numbers as the digital sequence. One n-bit binary number is generated during each period of the clock signal CLOCK. The binary numbers generated in consecutive periods of the clock signal differ from one another by one least-significant bit.

The analog signal generator 105 is composed of the n-bit digital-to-analog converter 252. The digital-to-analog converter 252 receives a digital sequence at its input and generates the time-varying analog signal in response to the digital sequence. Since the digital sequence increments by one least-significant bit each period of the clock signal CLOCK, the time-varying analog signal has a staircase waveform that increments in steps of a voltage corresponding to one least-significant bit in each period of the clock signal during the conversion period.

The output of the digital-to-analog converter 252 may be connected directly to the analog bus 108 or may be connected to the analog bus via the optional buffer 254. If the buffer is included, the output of the digital-to-analog converter 252 is connected to the input of the buffer instead of to the analog bus, and the output of the buffer is connected to the analog bus. The buffer should be included if the current driving capability of the digital-to-analog converter 252 is insufficient to meet the input current requirements of each channel circuit 104 multiplied by the number of channel circuits included in the digital-to-analog converter 200.

The analog drive circuit 105 of the embodiment shown in FIG. 3 includes three additional optional elements, namely, the latch 251., the analog reset switch 256 and the conversion law module 258. The latch 251 will be described below.

The analog reset switch 256 can be included in the analog drive circuit 105 to help return the analog bus 108 to its starting state before the beginning of each conversion period. If the output of the digital-to-analog converter 252 or the output of the buffer 254, if included, return the analog bus to its initial state in the time allowed for resetting the analog bus, the analog reset switch can be omitted. If included, the analog reset switch is connected between the analog bus 108 and ground and has a control input connected to the end-of-count line 272. During each conversion period, the end-of-count signal EOC holds the analog reset switch OFF. At the end of the conversion period, the end-of-count signal momentarily turns the analog reset switch ON, which resets the analog bus by momentarily connecting it to ground. The analog reset switch may alternatively reset the analog bus by connecting the analog bus to a potential other than ground.

The optional conversion law module 258 can be included when it desired to give the multi-channel digital-to-analog converter 200 a non-linear conversion characteristic. A non-linear conversion characteristic may be used to perform gamma correction in a video display, for example. When the conversion module is omitted, the input of the analog signal generator 105 is connected directly to the digital bus 106 so that the digital sequence received by the input of the n-bit digital-to-analog converter 252 is the same as the digital sequence on the digital bus 106. In this configuration, the multi-channel digital-to-analog converter 200 has a linear conversion characteristic. When the analog signal generator includes the conversion law module 258, the conversion law module is interposed between the digital bus 106 and the input of the analog signal generator 105 as shown in FIG. 3. The conversion law module changes the digital sequence received by the input of the digital-to-analog converter 252 relative to the digital sequence on the digital bus 106 so that the time-varying analog voltage on the analog bus 108 has a non-linear relationship to the digital sequence on the digital bus. The non-linear relationship between the time-varying analog signal and the digital sequence imposes a non-linear conversion characteristic on the digital-to-analog conversions performed in each of the channel circuits 104.

Conventionally, gamma correction is applied to a digital video signal composed of n-bit digital input words by applying digital processing to the digital input words. This conventional processing has the disadvantage that the gamma-corrected digital video signal generated by such processing has a reduced resolution in any portion of the gamma curve that imposes compression on the digital input words. Performing gamma correction by modifying the relationship between the digital sequence generated by the digital sequence generator 103 and the time-varying analog signal generated by the analog signal generator 105 provides gamma correction without this loss of resolution, and provides a correction accuracy greater than that obtained when n-bit gamma correction is applied digitally to n-bit digital input words.

The conversion law module 258 may change the digital sequence received from the digital bus 106 by performing arithmetic operations on the digital sequence. Alternatively, the conversion law module may be composed of a look-up table that generates the changed digital sequence when addressed by the digital sequence received from the digital bus. The number of bits in the numbers generated by the conversion law module in response to the n-bit numbers received from the digital bus may be different from n, i.e., greater than or less than n, to provide certain conversion characteristics.

When the conversion law module is embodied in a look-up table, by appropriately constructing the contents of the look-up table, a given digital input word can easily be mapped to any analog level that can be produced by the digital-to-analog converter 252. This enables any arbitrary conversion characteristic to be implemented easily. Moreover, the ease with which look-up tables stored in rewritable memory can be reprogrammed allows for very fast modification of the conversion characteristic.

Although the conversion law module 258 is described above as a digital module interposed between the digital bus 106 and the input the digital-to-analog converter 252, the relationship between the digital sequence on the digital bus and the time-varying analog signal on the analog bus 108 may alternatively be modified by an analog conversion law module located in or following the digital-to-analog converter 252. For example, the multi-channel digital-to-analog converter 200 may be given a logarithmic conversion characteristic by driving current generated by the digital-to-analog converter 252 through a diode, and feeding the voltage across the diode through a suitable buffer amplifier to the analog bus as the time-varying analog signal.

The channel circuit 104 of Channel 1 will now be described. The channel circuits of the remaining channels are identical. The channel circuit is composed of the digital input 120, the digital comparator 122, the analog sampler 124 and the analog output 126.

The digital comparator 122 is composed of the n-bit register 260, the digital word comparator 261 and the optional latch 262. The register has a data input 130 connected to the digital input 120 and a data output connected to the digital word comparator. The register also has a clock input connected to the end-of-count line 272. The end-of-count signal EOC asserted on the end-of-count line at the end of each conversion period transfers the digital input word on the digital input to the output of the register. The digital input word remains on the output of the register until the end-of-count signal is next asserted at the end of the next conversion period.

Thus, the register holds the digital input word presented to the digital word comparator through the conversion period.

The digital word comparator 261 has a first input connected to the output of the n-bit register 260, a second input 132 connected to the digital bus 106 and an output connected to the input of the latch 262. The output of the digital word comparator changes state during the clock period in which the one of the n-bit numbers constituting the digital sequence on the second input of the digital word comparator is numerically equal to the digital input word on the first input.

The latch 262 has an input connected to the output of the digital word comparator 261 and an output connected to the control input of the analog sampler 124. The latch also has a clock input connected to the clock line 270, and a reset input connected the end-of-count line 272. At the end of each conversion period, the end-of-count signal EOC asserted on the end-of-count line 272 resets the output of the latch 262 to a first state. The output of the digital word comparator changing state, as described above, changes the input of the latch to the second state. Consequently, on the next transition of the clock signal CLOCK, the output of the latch changes to the second state. The output of the latch stays in the second state until the end-of-count signal EOC resets the latch at the end of the conversion period.

The latch 262 can be omitted if the time of comparison of the digital word comparator 261 is fixed, i.e., if the time required by the digital word comparator to determine that the n-bit number on one of its inputs is numerically equal to the digital input word on the other of its inputs is independent of the digital input word, or if the digital word comparator has a clocked output. Otherwise, the time delay between an n-bit number that matches the digital input word appearing on the digital bus 106 and the output of the digital word comparator changing state is input word dependent. An input word-dependent delay can cause an input word-dependent error in the analog output voltage. Including the latch 262 makes the delay independent of the input word, and thus eliminates this error.

The analog sampler 124 is composed of the sampling switch 264 and the buffer amplifier 266. The sampling switch is connected in series between the analog bus 108 and the analog input of the buffer amplifier. The output of the buffer amplifier is connected to the analog output 126. The sampling switch has a control input connected to the output 134 of the digital comparator 122.

At the end of each conversion period, the end-of-count signal EOC asserted on the end-of-count line 272 resets the output of the latch 262 to a first state. In its first state, the output of the latch applied to the control input of the sampling switch 264 closes the sampling switch. This allows the analog input and the analog output of the buffer amplifier 266 to follow the time-dependent analog signal on the analog bus 108. When the output of the digital word comparator 261 changes state, the input of the latch changes to the second state. On the next transition of the clock signal CLOCK, the output of the latch changes state, and opens the sampling switch 264. This stops the analog input and the analog output of the buffer amplifier from following the time-varying analog signal on the analog bus 108, and holds the output voltage of the buffer amplifier at a level corresponding to the level on the analog bus at the time that the output of the latch changed state. The output of the buffer amplifier stays in its held state until the sampling switch is closed again by the latch 262 being reset at the end of the conversion period.

If the delay introduced by the latch 262 or by clocking the output of the digital word comparator 261 causes the level of the time-varying analog signal on the analog bus 108 when the control input of the sampling switch 264 changes state to differ from the level of the analog signal when the n-bit number on one input of the digital word comparator becomes numerically equal to the digital input word on the other input, the latch 251 should be included in the analog drive circuit 105. Otherwise, a systematic error will exist in the voltage level on the analog output 126. The latch 251 is clocked by the clock signal CLOCK, and delays the digital sequence input to the digital-to-analog converter 252 relative to the digital sequence on the digital bus 106. This delay ensures that the level of the time-varying analog signal on the analog bus 108 when the control input of the sampling switch 264 changes state is the same as that when the n-bit number on one input to the digital word comparator becomes numerically equal to the digital input word on the other input.

Operation of a highly-simplified embodiment of the circuit shown in FIG. 3 during two successive conversion periods CP1 and CP2 will now be described with reference to FIGS. 3 and 4A–4F. In the highly-simplified embodiment described, the digital input words are 4-bit words, i.e., n=4, and it will be assumed that the signal on the control input of the sampling switch 264 changes state at the same time that the n-bit number on one input to the digital word comparator 261 becomes numerically equal to the digital input word on the other. In other words, the embodiment described lacks the latch 251, and the latch 262 has a zero delay.

Figures 4A, 4B:
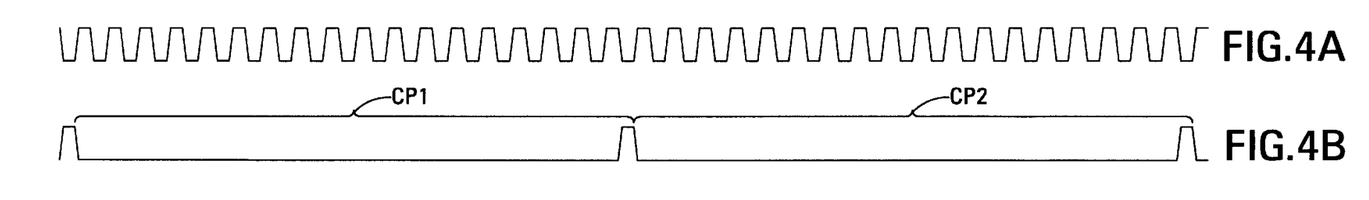
FIGS. 4A–4F illustrate the operation of the embodiment of the multi-channel digital-to-analog converter show in FIG. 3.

FIG. 4A shows the clock signal CLOCK on the clock line 270.

FIG. 4B shows the end-of-count signal EOC on the end-of-count line 272. The time between successive end-of-count signals defines the conversion periods CP1 and CP2. As noted above, the number of clock periods in each conversion period is equal to at least the number of clock periods required for the digital sequence generator to generate the digital sequence. In addition, when the digital input word on the digital input 120 is at the maximum of the input range, i.e., $2^n-1$, the analog sampler 124 samples the time-varying analog signal during the last clock period before the end-of-count signal is asserted and the voltage level on the analog output 126 is reset to zero. To provide the voltage on the analog output a longer time in which to settle, and to accommodate the reset operations performed by assertion of the end-of-count signal EOC, additional clock periods may be added to the conversion period. In the example shown, each conversion period corresponds to 18 periods of the clock signal CLOCK. The 4-bit digital counter 250 requires 16 clock periods to count from 0 to 15, one additional clock period is provided to allow the voltage level on the analog output to settle, and another additional clock period is provided to accommodate the reset operations.

Figure 4C:
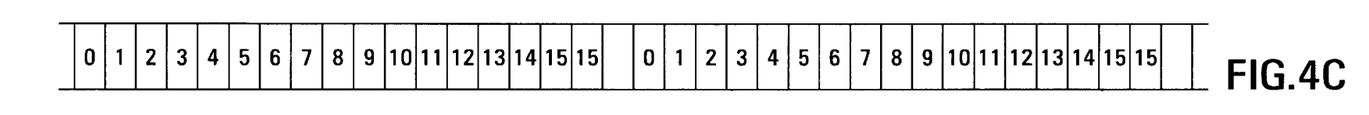

FIG. 4C schematically shows the decimal equivalents of the 4-bit numbers constituting the digital sequence generated by the digital sequence generator 103 in response to the clock signal CLOCK. At the beginning of the conversion period, the 4-bit number output by the counter 250 is set to zero. The 4-bit number output by the counter increments by one each period of the clock signal and reaches 15 (1111) after 16 clock periods. In the example shown, the number output by the counter remains set to 15 for one additional clock period. In the following clock period, which marks the end of the conversion period, the end-of-count signal EOC resets the number output by the counter 250 to zero.

Figure 4D:
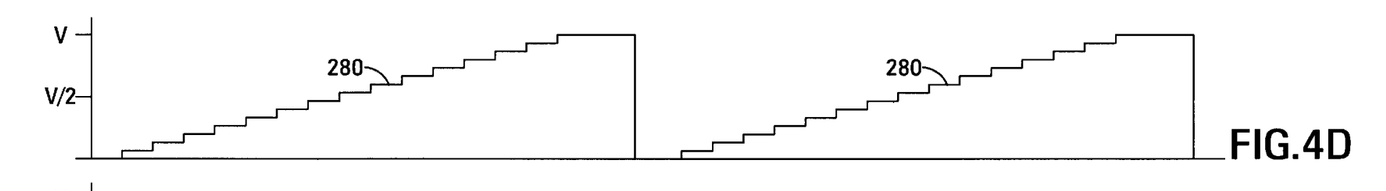

FIG. 4D is a graph showing the time-varying analog signal 280 on the analog bus 108. The time-varying analog signal is generated by the analog signal generator 105 in response to the digital sequence shown in FIG. 4C. In this example, the time-varying analog signal is a staircase ramp signal that starts at zero volts and that, every clock period, increments by a fraction $1/2^n$ of the full-scale output voltage of the multi-channel digital-to-analog converter 200. For example, if the full-scale output voltage of the converter 200 is 1 Volt, the time-varying analog signal increments by 62.5 mV every clock period.

In the example shown, the time-varying analog signal 280 remains at a level corresponding to the full-scale output voltage of the multi-channel digital-to-analog converter 200 for one additional period of the clock signal CLOCK. In the following clock signal period, the time-varying analog signal is reset to zero by the end-of-count signal EOC resetting the n-bit counter 250 to zero. Return of the time-varying analog signal to zero may be assisted by the end-of-count signal also turning ON the analog reset switch 256.

Figure 4E:
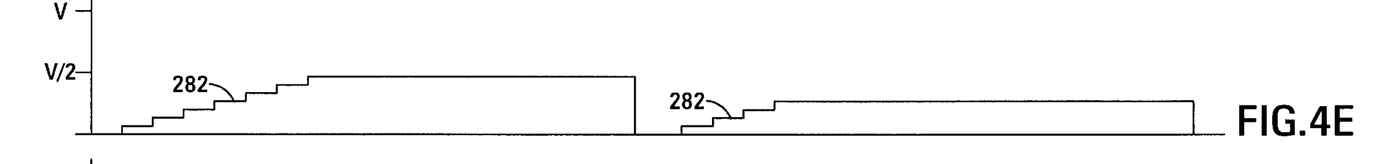

FIG. 4E is a graph showing the signal 282 on the analog output 126 of the channel circuit 104 of channel 1 during the two successive conversion periods CP1 and CP2. In the conversion period CP1, the digital input word of channel 1 is 0111 (7) and in the conversion period CP2, the digital input word of channel 1 is 0100 (4). During the conversion period CP1, the 4-bit numbers output by the 4-bit digital counter 250 as the digital sequence (FIG. 4C) successively increment, the time-dependent analog signal 280 (FIG. 4D) increases in level and the signal 282 on the analog output of channel 1 increases in level. The signal 282 increases in level until the n-bit number output by the counter 250 is numerically equal to the digital input word, i.e., 0111. When this equality occurs, the output of the digital comparator 122 changes state and opens the sampling switch 264 in the analog sampler 124. This holds the signal 282 at a level corresponding to 7/16 of the full-scale output voltage V for the remainder of the conversion period CP1. The signal 282 is reset to zero when the end-of-count signal EOC resets the digital counter 250 and the latch 262. Resetting the digital counter resets the time-varying analog signal on the analog bus 108 to zero. Resetting the latch closes the sampling switch 264, which re-connects the input of the buffer amplifier 266 to the analog bus.

Operation of the channel circuit 104 of channel 1 during the conversion period CP2 is similar, except that the signal 282 on the analog output 126 of channel 1 stops increasing when the 4-bit number output by the counter 250 is numerically equal to a different digital input word, i.e., 0100. When this equality occurs, the signal 282 is held at a level corresponding to 4/16 of the fill-scale output voltage V for the remainder of the conversion period.

Figure 4F:
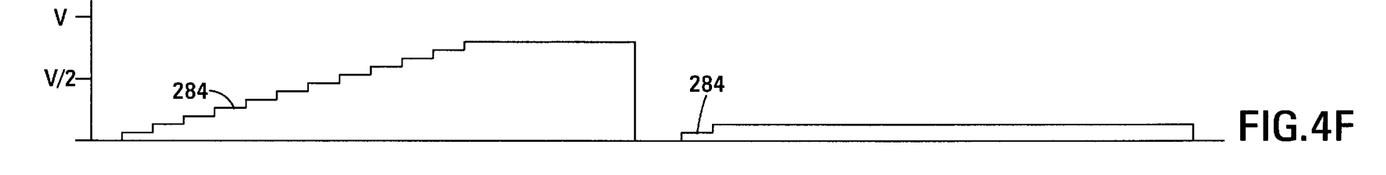

FIG. 4F is a graph showing the signal 284 on the analog output 126 of the channel circuit 104 of channel N during the two successive conversion periods CP1 and CP2. In the conversion period CP1, the digital input word of channel N is 1100 (12) and in the conversion period CP2, the digital input word of channel N is 0010 (2). Operation of the channel circuit of channel N during the conversion periods CP1 and CP2 is similar to that described above, except that the signal 284 stops increasing when the 4-bit number output by the counter 250 is numerically equal to different digital input words, i.e., to 1100 during the conversion period CP1 and to 0010 during the conversion period CP2. When these equalities occur, the voltage 284 on the analog output of channel N is held at a level corresponding to 12/16 of the full-scale output voltage V for the remainder of the conversion period CP1 and at a level corresponding to 2/16 of the full-scale output voltage V for the remainder of the conversion period CP2.

In embodiments that include a conversion law module as described above, the voltage on the analog output 126 of a channel stops increasing when the n-bit number on the digital bus 106 is numerically equal to the digital input word of the channel. However, due to the non-linear relationship between the time-varying analog signal on the analog bus 108 and the digital sequence on the digital bus, the time-varying analog signal does not increment in the equal steps shown in FIG. 4D. When the conversion module is included, the voltage level on the analog output 126 still has a predetermined relationship to the digital input word received on the digital input 120, but the predetermined relationship is not the linear relationship shown in FIGS. 4E and 4F.

In the preferred embodiment shown in FIG. 3, the analog signal generator 105 includes the n-bit digital-to-analog converter 252 that generates the time-varying analog signal from the digital sequence generated by the digital sequence generator 103. However, this is not critical to the invention. Other circuits are known in the art capable of generating a time-varying analog signal having a predetermined relationship to a digital sequence. For example, a relatively simple analog ramp generator, phase-locked to the digital sequence, can be used. The slope and endpoints of the ramp can be calibrated to generate the desired conversion characteristic. The analog ramp generator may be configured to have a linear characteristic or a non-linear characteristic. The characteristic of the analog ramp generator determines the relationship between the digital sequence and the time-varying analog signal.

An analog signal generator generates a continuously-varying analog signal as the time-varying analog signal that may increase the accuracy constraints on the timing of the sampling performed by the analog sampler 124. Using the digital-to-analog converter 252 to generate the time-varying analog signal results in the staircase waveform shown in FIG. 4D. The staircase waveform includes a series of steps during which the time-varying analog signal does not change and can therefore be sampled accurately even if the timing of the sampling lacks certainty.

Figure 5A:
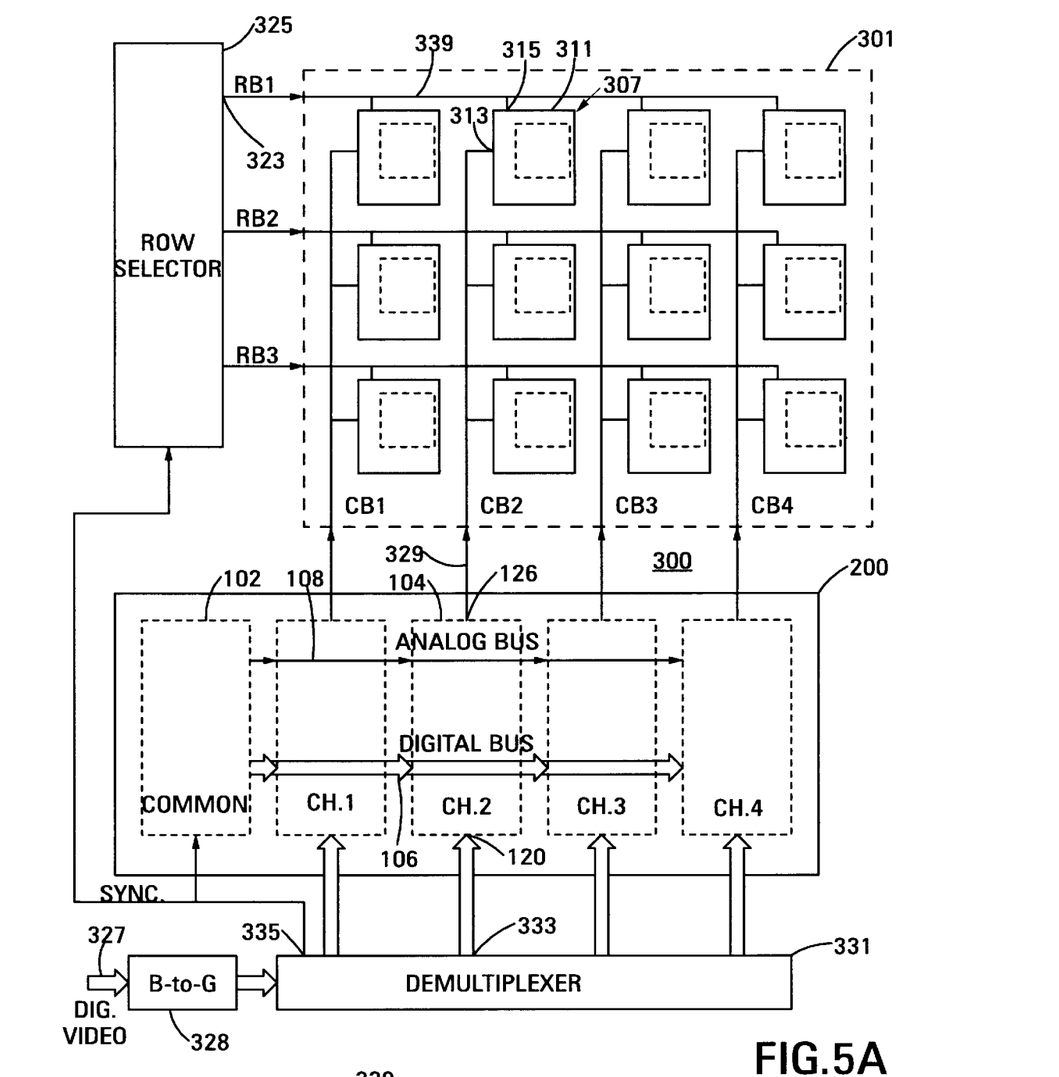
FIG. 5A is a block diagram of an analog drive circuit according to the invention that can be used as part of a miniature video display.
Figure 5B:
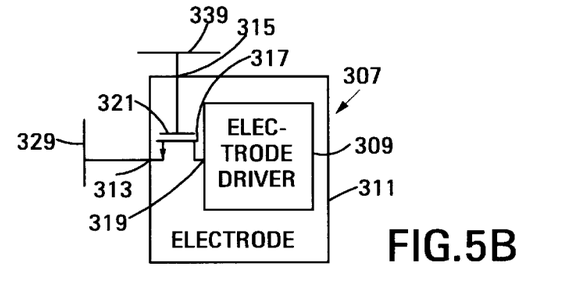
FIG. 5B is a block diagram showing the pixel circuit of the analog drive circuit shown in FIG. 5A.

FIG. 5A and 5B show a highly-simplified example of an analog drive circuit 300 for driving a miniature video display based on a ferroelectric liquid-crystal material. The circuit is based on the analog drive circuits disclosed in the above-mentioned patent applications Ser. Nos. 09/070,487 and 09/070,669. The circuit includes the multi-channel digital-to-analog converter 200 according to the invention that replaces the analog sampling circuit of the analog drive circuits described in the patent applications.

The multi-channel digital-to-analog converter 200 enables the analog drive circuit 300 to operate in response to a digital video signal, such as that generated by a digital camera. Each frame of such a digital video signal is composed of a sequence of three sub-frames, one for each primary color. The video display that incorporates the analog drive circuit displays a picture in response to each sub-frame of the digital video signal while being illuminated with light of the corresponding primary color.

In the embodiment of the digital-to-analog converter 200 incorporated into the analog drive circuit 300, the digital sequence generator generates digital sequence that is a series of n-bit Gray codes whose binary equivalents constitute a monotonic ramp. Using a series of Gray codes as the digital sequence significantly increases the reliability of the numerical equality detection performed by the digital word comparator 261. Binary codes generated in certain consecutive clock periods differ several bits and may differ in all of their bits as happens when, for example, the binary codes generated in consecutive clock periods are 0111 and 1000. The change from 0111 to 1000 may include a transitory false state, such as 1100. A conversion error occurs when the digital word comparator determines that the transitory false state is numerically equal to the digital input word. Gray codes generated in consecutive clock periods differ in only one bit and therefore do not suffer from transitory false states and attendant false numerical equality detections.

To generate a digital sequence composed of a series of Gray codes, the digital sequence generator 103 may include an n-bit Gray code counter as the n-bit counter 250. Alternatively, an n-bit binary counter followed by a binary-to-Gray converter may be used as the n-bit counter 250.

When the digital sequence is composed of a series of Gray codes, the analog signal generator 124 may include a Gray code digital-to-analog converter as the digital-to-analog converter 252. Alternatively, a conventional binary digital-to-analog converter preceded by a Gray-to-binary converter may be used as the digital-to-analog converter 252. Gray-to-binary and binary-to-Gray converters are known in the art and will therefore not be described here.

Elements of the embodiment shown in FIG. 5A and 5B that correspond to elements of the embodiment shown in FIGS. 2 and 3 are indicated using the same reference numerals and will not be described again here. To simplify the drawings, reference numerals are applied to only one exemplary pixel and to the elements connected to that pixel.

In the highly-simplified example shown, the analog drive circuit 300 includes an array 301 of pixels arranged in three rows each of four pixels. Each pixel includes a pixel circuit.

An exemplary pixel circuit is shown at 307. In this example, each sub-frame of the digital video signal is composed of one n-bit digital input word for each pixel in the array, i.e., 12 n-bit digital words, and the multi-channel digital-to-analog converter 200 includes four channel circuits 104, one for each of the four columns of the array. In a practical embodiment, the array would typically be composed of 640×480 pixels and the multi-channel digital-to-analog converter would have 640 channels. However, the arrangement shown can easily be used in arrays with substantially fewer or more pixels, and converters with substantially fewer or more channels are possible.

A column bus 329 connects the analog output 126 of each channel circuit 104 of the multi-channel digital-to-analog converter 200 to all the pixel circuits 307 in one column of the array 301. The converter 200 derives an analog sample from each of the digital input words constituting the sub-frame of the digital video signal. Each analog sample is distributed to the pixel circuit located in a position in the array corresponding to the position of the corresponding digital input word in the sub-frame of the digital video signal. The pixel circuit then generates a two-state electrode drive signal that has a duty cycle determined by the analog sample. The duty cycle of the electrode drive signal defines the brightness of the pixel of which the pixel circuit forms part.

FIG. 5B shows a block diagram of the pixel circuit 307. The pixel circuit includes the electrode driver circuit 309, the sample input 313, the selector input 315 and the selector switch 317. The electrode driver circuit 309 generates the two-state electrode drive signal that drives the reflective electrode 311. The selector switch is connected in series between the sample input and the input 319 of the electrode driver circuit. The selector switch has a control gate 321 connected to the selector input. The reflective electrode typically overlays the electrode driver circuit and selector switch.

Referring again to FIG. 5A, the sample inputs 313 of all the pixel circuits 307 in each column of the array 301 are connected by the corresponding column bus 329 to the analog output 126 of the corresponding channel circuit 104 of the multi-channel digital-to-analog converter 200. The selector inputs 315 of all the pixel circuits in each row of the array are connected to a corresponding one of the outputs 323 of the row selector 325.

The driver circuit 300 receives the digital video signal via the video input 327. In the digital video signal, each sub-frame is composed of one n-bit digital word for each pixel in the array 301. The digital words are arranged in raster-scan order, starting at the top, left-hand corner. Typically, n=8 in this application, but each digital word can be composed of more or fewer bits.

The digital video input 327 is connected to the input of the binary-to-Gray converter 328. The binary-to-Gray converter modifies the digital video signal by converting the digital words of the digital video signal from binary to equivalent Gray codes. The modified digital video signal generated by the binary-to-Gray converter is connected to the input of the video demultiplexer 331. When the digital sequence generated by the digital sequence generator 103 is a sequence of binary numbers, the binary-to-Gray converter is not required.

The video demultiplexer 331 includes an output 333 corresponding to each column of the array 301 and to the channel circuit 104 of each channel (CH1–CH4) of the multi-channel digital-to-analog converter 200. Each output is connected to the digital input 120 of one channel circuit 104 of the converter 200. The demultiplexer processes each line of the modified digital video signal received at its input to deliver the Gray code for each pixel circuit in one row of the array to the one of its outputs corresponding to the location of the pixel circuit in the row. The Gray code delivered to each output of the demultiplexer is the digital input word of the channel circuit of the digital-to-analog converter 200 to which the output is connected.

The video demultiplexer 331 is shown as providing the sync. signal SYNC 335 that is connected to the common circuitry 102 of the multi-channel digital-to-analog converter 200 and to the row selector 325. The sync. signal is extracted from the digital video signal received by the video demultiplexer. The clock signal CLOCK and the end-of-conversion signal EOC in the multi-channel digital-to-analog converter 200 are phase-locked to the sync signal SYNC. Since the multi-channel digital-to-analog converter generates analog samples of all of the pixel circuits 307 in one row of the array 301 simultaneously, the conversion period of the converter 200 can be as long as the line period of the digital video signal. The row selector 325 is clocked at the line rate of the digital video signal and is synchronized by the frame sync. of the digital video signal. The sync. signal SYNC may alternatively be provided from an external source (not shown).

The row selector 325 receives the sync. signal SYNC from the video demultiplexer 331 as just described. The row selector includes an output 323 corresponding to each row in the array 301. This output is connected by the row bus 339 to the select inputs 315 of all the pixel circuits in the row. The output of the row selector has two possible states, an activate state and a deactivate state. The activate state switches all the selector switches 317 connected to the output ON, while the deactivate state switches all the selector switches connected to the output OFF. Only one of the outputs of the row selector is in the activate state at any time. The outputs change to the activate state in raster-scan order, i.e., the output connected to the top row of the array changes to the activate state immediately after the frame sync. One line period later, the output connected to the next row of the array changes to the activate state and the output connected to the top row changes to the deactivate state.

Figure 6A:
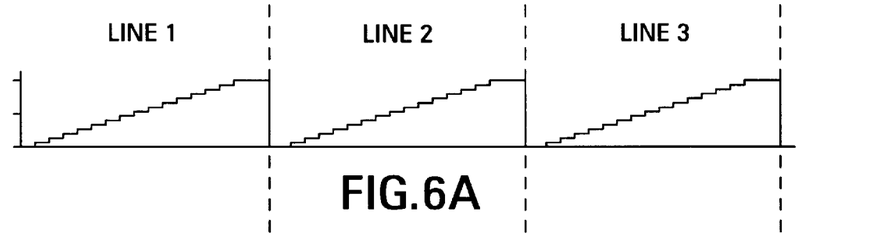
FIGS. 6A–6H illustrate the operation of the analog drive circuit shown in FIG. 5A.
Figure 6B:
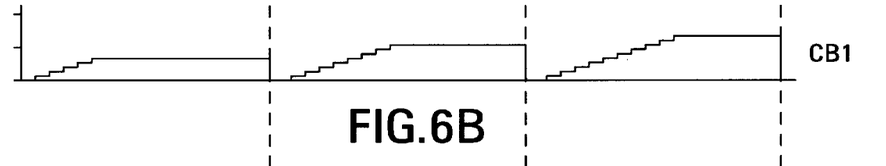
Figure 6C:
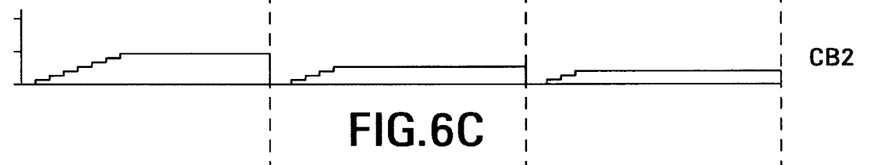
Figure 6D:
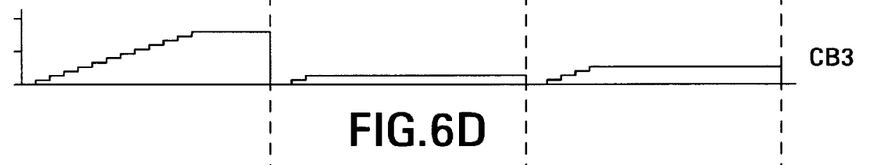
Figure 6E:
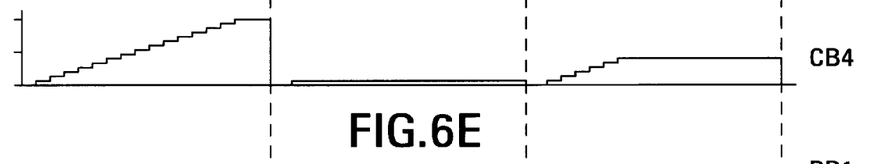

Operation of the analog driver circuit 300 during one sub-frame of the digital video signal will now be described with reference to FIGS. 6A–6H. As noted above, during each line of the digital video signal, each channel circuit 104 of the 4-channel digital-to-analog converter 200 receives the digital input word for one pixel in one row of the array 301 at its digital input 120 and provides a respective analog sample on its analog output 126. FIG. 6A shows the time-varying analog signal on the analog bus 108. The analog signal generator generates one cycle of the analog video signal during each line of the digital video signal.

Figure 6F:
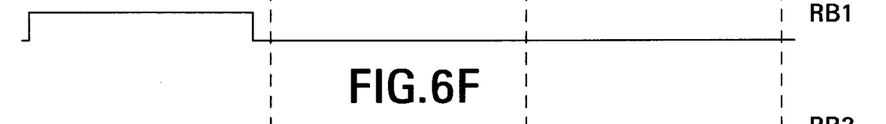
Figure 6G:
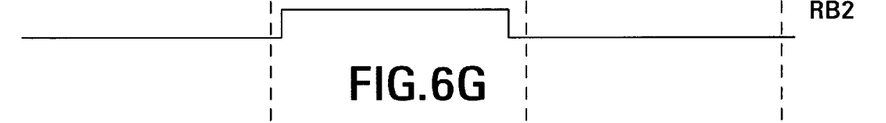
Figure 6H:
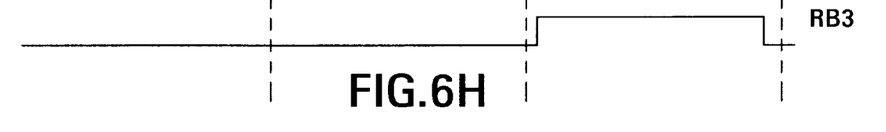

FIGS. 6B–6E show examples of the waveforms imposed on the column busses CB1 through CB4, respectively, by the analog outputs 126 of the channel circuits 104 of the channels CH1–CH4 during the three lines of the sub-frame. During each conversion period, which corresponds to one line of the digital video signal, each column bus, such as the column bus CB2, distributes the analog sample generated by the channel circuit 104 to which it is connected to the sample inputs 313 of all the pixel circuits 307 connected to the column bus. However, the analog sample is accepted by only the pixel circuit located in the row whose row bus 339 is connected to the output 323 of the row selector 325 that is in the activate state. FIGS. 6F–6H show the waveforms imposed on the row busses RB1–RB3 by the respective outputs of the row selector.

For example, when the four channel circuits 104 of the digital-to-analog converter 200 collectively generate four analog samples from the four digital input words derived from the first line of the sub-frame of the digital video signal (LINE 1), the output of the row selector 325 in the activate state is the output connected by the row bus RB1 to the pixel circuits in the top row of the array 301, as shown in FIG. 6F. The remaining two row busses RB2 and RB3 are connected to outputs in the deactivate state, as shown in FIGS. 6G and 6H, respectively. As a result, the four analog samples simultaneously generated by the converter 200 during LINE 1 are distributed along the column busses CB1–CB4 to all the pixel circuits in the array, but are accepted only by the pixel circuits in the top row of the array, i.e., by the pixel circuits whose selector inputs are connected to the row bus RB1 driven by the output of the row selector 325 in the activate state.

When the four analog samples simultaneously generated by the converter 200 are generated from the digital input words derived from the second line (LINE 2) of the digital video signal, the analog samples are accepted only by the pixel circuits in the second row of the array 301 as a result of the output of the row selector connected to the row bus RB2 being in the activate state only during LINE 2 (compare FIG. 6G with FIGS. 6F and 6H during LINE 2). When the four analog samples simultaneously generated by the converter 200 are generated from the digital input words derived from the third line (LINE 3) of the digital video signal, they are accepted only by the pixel circuits in the third row of the array as a result of the output of the row selector connected to the row bus RB3 being in the activate state only during LINE 3 (compare FIG. 6H with FIGS. 6F and 6G during LINE 3).

As noted above, when the digital input word of one of the channel circuits 104 of the multi-channel digital-to-analog converter 200 is numerically equal to the last n-bit word in the digital sequence on the digital bus 106 (see FIG. 6E during LINE 1), the analog voltage on the sample input 313 stops changing during the clock period that coincides with the end of the digital sequence. To ensure that the voltage at the input 319 of the electrode driver circuit 309 reaches the same level as the voltage on the corresponding analog output 126, one or more additional clock periods are inserted between the clock period that marks the end of the digital sequence and the clock period in which the end-of-conversion signal EOC is asserted. In addition, the output 323 of the row selector 325 connected to the row bus 339 of the row of pixel circuit to which the analog samples generated by the converter 200 belong should switch to its activate state at or after the beginning of the conversion period, and should remain in the activate state through the conversion period including the additional clock periods to enable the voltage at the input 319 to settle. However, the output of the row selector should switch to its deactivate state before the EOC signal is asserted and the sampling switch 264 returns to its closed state. Thus, the output of the row selector should switch from the activate state to the deactivate state during, but before the end of, the additional clock periods included to allow the voltage on the input 319 to settle. An example of the preferred relationship between the voltage on the analog output of the converter 200 and the output of the row selector can be seen by comparing FIGS. 6E and 6F during LINE 1.

The number of clock periods required in addition to the $2^n$ clock periods required to advance the n-bit digital counter 250 from zero to $2^n-1$ depends on the duration of each clock period, the capacitance and resistance of the column busses 329, the input capacitance of the electrode driver circuit 309 and the drive capability of the buffer amplifier 266 (FIG. 3) in the channel circuits 104. The number of clock periods added should be sufficient to allow the analog voltage at the sample input 319 of the electrode driver circuit most remote from the multi-channel digital-to-analog converter 200 to settle.

Although this disclosure describes illustrative embodiments of the invention in detail, it is to be understood that the invention is not limited to the precise embodiments described, and that various modifications may be practiced within the scope of the invention defined by the appended claims.

We claim:

1. A method of performing matched digital-to-analog conversions in which, in each of N parallel channels, a digital input word is converted into a corresponding analog output, the method comprising:

generating a digital sequence;

in response to the digital sequence, generating a time-varying analog signal having a predetermined relationship to the digital sequence;

distributing the digital sequence and the time-varying, analog signal to the N parallel channels; and in each of the N channels:

digitally comparing the digital input word with the digital sequence, and when the digital sequence is numerically equal to the digital input word, sampling the time-varying analog signal to provide the analog output.

2. The method of claim 1, in which generating the time-varying analog signal includes subjecting the digital sequence to digital-to-analog conversion to generate the time-varying analog signal.

3. The method of claim 1, in which generating the time-varying analog signal includes generating an analog ramp signal phase-locked to the digital sequence as the time-varying analog signal.

4. The method of claim 1, in which generating the digital sequence includes:

providing a clock signal; and performing a binary count of the clock signal to generate the digital sequence.

5. The method of claim 1, in which generating the digital sequence includes:

providing a clock signal; and in response to the clock signal, generating Gray codes as the digital sequence.

6. The method of claim 1, in which, in generating the time-varying analog signal, the predetermined relationship between the time-varying signal and the digital sequence is non-linear.

7. A multi-channel, parallel, matched digital-to-analog converter that, in each of N channels, receives a digital input word and generates an analog output in response to the digital input word, the digital-to-analog converter comprising:

a digital sequence generator generating a digital sequence;

an analog signal generator that operates in response to the digital sequence to generate a time-varying analog signal having a predetermined relationship to the digital sequence for distribution to the N channels; and in each one of the N channels, a channel circuit including:

a digital comparator connected to receive the digital sequence and the digital input word of the one of the N channels, and configured to indicate when the digital sequence is numerically equal to the digital input word, and an analog sampler connected to receive the time-varying analog signal, operating in response to the digital comparator, and configured to provide, as the analog output of the one of the N channels, a sample of the time-varying analog signal when the digital comparator indicates that the digital sequence is numerically equal to the digital input word.

8. The multi-channel digital-to-analog converter of claim 7, in which the analog signal generator includes a digital-to-analog converter connected to receive the digital sequence and generating the time-varying analog signal in response thereto.

9. The multi-channel digital-to-analog converter of claim 7, in which the analog signal generator includes an analog ramp generator connected to receive the digital sequence and generating the time-varying analog signal phase-locked to the digital sequence.

10. The multi-channel digital-to-analog converter of claim 9, in which the analog ramp generator has a non-linear characteristic.

11. The multi-channel digital-to-analog converter of claim 7, additionally comprising a conversion law module that changes the predetermined relationship between the time-varying analog signal and the digital sequence to a non-linear relationship.

12. The multi-channel digital converter of claim 11, in which the conversion law module operates in response to the digital sequence generated by the digital sequence generator to generate a modified digital sequence that causes the analog signal generator to generate the time-varying analog signal having the non-linear relationship to the digital sequence.

13. The multi-channel digital converter of claim 11, in which the conversion law module includes a non-linear analog circuit configured to receive the time-varying analog signal generated by the analog signal generator and to generate therefrom a modified time-varying analog signal for distribution to the N channels.

14. The multi-channel digital-to-analog converter of claim 7, in which the digital sequence generator includes a binary counter.

15. The multi-channel digital-to-analog converter of claim 14, in which:

the digital input word is an n-bit word; and
the binary counter includes an n-bit counter.

16. The multi-channel digital-to-analog converter of claim 7, in which the digital sequence generator includes a sequential Gray code generator.

17. The multi-channel digital-to-analog converter of claim 7, in which the analog sampler includes a track-and-hold circuit.

18. The multi-channel digital-to-analog converter of claim 17, in which the track-and-hold circuit includes:

a buffer amplifier comprising an output connected to the analog output, and an analog input; and a sampling switch connected in series between the analog signal generator and the analog input of the buffer amplifier, the sampling switch operating when the digital comparator indicates that the digital sequence is numerically equal to the digital input word.

19. The multi-channel digital-to-analog converter of claim 7, in which the analog sampler includes a sample-and-hold circuit.

20. An analog drive circuit for a video display, the analog drive circuit operating in response to a digital video signal including frames of digital words arranged in lines, the analog drive circuit comprising:

pixel circuits arranged in an array of rows and columns, and each including a sample input and a selector input;

column busses interconnecting the sample inputs of the pixel circuits in respective ones of the columns of the array;

row busses interconnecting the selector inputs of the pixel circuits in respective ones of the rows of the array;

a row selector including outputs connected to respective ones of the row busses;

a video demultiplexer including an input connected to receive the digital video signal, and outputs corresponding to the columns of the array, the video multiplexer directing the digital words in the lines of the digital video signal to respective ones of the outputs, each of the outputs receiving one of the digital words as a digital input word; and a multi-channel digital-to-analog converter, including:

channel circuits corresponding to the columns of the array, a digital sequence generator generating a digital sequence, an analog signal generator that operates in response to the digital sequence to generate a time-varying analog signal having a predetermined relationship to the digital sequence for distribution to the channel circuits, in which:

each of the channel circuits comprises:

a digital comparator connected to receive the digital sequence and the digital input word from one of the outputs of the video demultiplexer, and configured to indicate when the digital sequence is numerically equal the digital input word; and an analog sampler connected to receive the time-varying analog signal, including an analog output connected to one of the column busses, and configured to provide an analog sample of the time-varying analog signal to the analog output when the digital comparator indicates that the digital sequence is numerically equal to the digital input word.

21. The analog drive circuit of claim 20, in which the row selector is configured to activate the select inputs of only the pixel circuits in the one of the rows of the array corresponding to the one of the lines of the digital video signal to which the digital input words belong.

22. The analog drive circuit of claim 20, in which the analog signal generator includes a digital-to-analog converter connected to receive the digital sequence and generating the time-varying analog signal in response thereto.

23. The analog drive circuit of claim 20, in which:

the analog drive circuit additionally comprises a binary-to-Gray code converter that converts binary digital words of the digital video signal to Gray-code digital words; and the digital sequence generator is configured to generate the digital sequence as a series of Gray codes.

24. The analog drive circuit of claim 20, additionally comprising a conversion law module that changes the predetermined relationship between the time-varying analog signal and the digital sequence to a non-linear relationship.

* * * * *